US008199785B2

(12) United States Patent
Zheng et al.

(10) Patent No.: US 8,199,785 B2
(45) Date of Patent: Jun. 12, 2012

(54) THERMAL CHIRP COMPENSATION IN A CHIRP MANAGED LASER

(75) Inventors: Xueyan Zheng, Andover, MA (US); Jianying Zhou, Acton, MA (US); Vincent Bu, Woburn, MA (US); Daniel Mahgerefteh, San Francisco, CA (US)

(73) Assignee: Finisar Corporation, Sunnyvale, CA (US)

( * ) Notice: Subject to any disclaimer, the term of this patent is extended or adjusted under 35 U.S.C. 154(b) by 475 days.

(21) Appl. No.: 12/495,460

(22) Filed: Jun. 30, 2009

(65) Prior Publication Data
US 2010/0329666 A1 Dec. 30, 2010

(51) Int. Cl.
*H01S 3/00* (2006.01)
*H01S 3/04* (2006.01)
*H04B 10/12* (2006.01)

(52) U.S. Cl. ......... 372/34; 372/33; 372/38.08; 398/193; 398/199

(58) Field of Classification Search .............. 372/29.02, 372/33, 34, 38.02; 398/187, 192, 193, 199
See application file for complete search history.

(56) References Cited

U.S. PATENT DOCUMENTS

| | | |
|---|---|---|
| 3,324,295 A | 6/1967 | Harris |
| 3,973,216 A | 8/1976 | Hughes et al. |
| 3,999,105 A | 12/1976 | Archey et al. |
| 4,038,600 A | 7/1977 | Thomas |
| 4,561,119 A | 12/1985 | Epworth |
| 4,671,604 A | 6/1987 | Soref |
| 4,754,459 A | 6/1988 | Westbrook |
| 4,805,235 A | 2/1989 | Henmi |
| 4,841,519 A | 6/1989 | Nishio |
| 4,896,325 A | 1/1990 | Coldren |
| 4,908,833 A | 3/1990 | Chraplyvy et al. |
| 4,914,667 A | 4/1990 | Blonder et al. |
| 5,088,097 A | 2/1992 | Ono et al. |
| 5,119,393 A | 6/1992 | Oka et al. |
| 5,136,598 A | 8/1992 | Weller et al. |
| 5,170,402 A | 12/1992 | Ogita et al. |
| 5,177,630 A | 1/1993 | Goutzoulis et al. |
| 5,293,545 A | 3/1994 | Huber |
| 5,305,134 A | 4/1994 | Tsushima et al. |
| 5,325,378 A | 6/1994 | Zorabedian |
| 5,325,382 A | 6/1994 | Emura et al. |

(Continued)

FOREIGN PATENT DOCUMENTS
CA 2510352 3/2010
(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner* — Armando Rodriguez
(74) *Attorney, Agent, or Firm* — Maschoff Gilmore & Israelsen

(57) ABSTRACT

Thermal chirp compensation in a chirp managed laser. In one example embodiment, a method for thermal chirp compensation in a chirp managed laser (CML) includes several acts. First, a first bias condition and temperature is selected. Next, a first thermal chirp compensation signal is generated. Then, the laser is driven by biasing a first input drive signal with the first thermal chirp compensation signal. Next, a second bias condition and temperature is selected. Then, a second thermal chirp compensation signal is generated. Finally, the laser is driven by biasing a second input drive signal with the second thermal chirp compensation signal.

7 Claims, 4 Drawing Sheets

U.S. PATENT DOCUMENTS

| | | |
|---|---|---|
| 5,371,625 A | 12/1994 | Wedding et al. |
| 5,394,429 A | 2/1995 | Yamada et al. |
| 5,412,474 A | 5/1995 | Reasenberg |
| 5,416,629 A | 5/1995 | Huber |
| 5,434,693 A | 7/1995 | Tanaka et al. |
| 5,450,432 A | 9/1995 | Okuda |
| 5,459,799 A | 10/1995 | Weber |
| 5,465,264 A | 11/1995 | Buhler et al. |
| 5,477,368 A | 12/1995 | Eskildsen et al. |
| 5,550,667 A | 8/1996 | Krimmel et al. |
| 5,568,311 A | 10/1996 | Matsumoto |
| 5,592,327 A | 1/1997 | Gabl et al. |
| 5,642,371 A | 6/1997 | Tohyama et al. |
| 5,696,859 A | 12/1997 | Onaka et al. |
| 5,737,104 A | 4/1998 | Lee et al. |
| 5,777,773 A | 7/1998 | Epworth et al. |
| 5,805,235 A | 9/1998 | Bedard |
| 5,856,980 A | 1/1999 | Doyle et al. |
| 5,920,416 A | 7/1999 | Beylat et al. |
| 5,946,129 A | 8/1999 | Xu et al. |
| 5,953,139 A | 9/1999 | Nemecek et al. |
| 5,953,361 A | 9/1999 | Borchert |
| 5,974,209 A | 10/1999 | Cho et al. |
| 5,991,323 A | 11/1999 | Adams et al. |
| 6,018,275 A | 1/2000 | Perrett et al. |
| 6,081,361 A | 6/2000 | Adams et al. |
| 6,088,373 A | 7/2000 | Hakki |
| 6,091,743 A | 7/2000 | Yang |
| 6,096,496 A | 8/2000 | Frankel |
| 6,104,851 A | 8/2000 | Mahgerefteh |
| 6,115,403 A | 9/2000 | Brenner et al. |
| 6,148,017 A | 11/2000 | Borchert et al. |
| 6,157,025 A | 12/2000 | Katagiri et al. |
| 6,188,499 B1 | 2/2001 | Majima |
| 6,222,861 B1 | 4/2001 | Kuo et al. |
| 6,271,959 B1 | 8/2001 | Kim et al. |
| 6,282,003 B1 | 8/2001 | Logan et al. |
| 6,298,186 B1 | 10/2001 | He |
| 6,331,991 B1 | 12/2001 | Mahgerefteh |
| 6,351,585 B1 | 2/2002 | Amundson et al. |
| 6,353,623 B1 | 3/2002 | Munks |
| 6,359,716 B1 | 3/2002 | Taylor |
| 6,421,151 B1 | 7/2002 | Berger |
| 6,459,518 B1 | 10/2002 | Suzuki et al. |
| 6,473,214 B1 | 10/2002 | Roberts et al. |
| 6,486,440 B1 | 11/2002 | Crafts et al. |
| 6,506,342 B1 | 1/2003 | Frankel |
| 6,522,809 B1 | 2/2003 | Takabayashi et al. |
| 6,563,623 B1 | 5/2003 | Penninckx et al. |
| 6,577,013 B1 | 6/2003 | Glenn et al. |
| 6,580,739 B1 | 6/2003 | Coldren |
| 6,618,513 B2 | 9/2003 | Evankow, Jr. |
| 6,628,690 B1 | 9/2003 | Fish et al. |
| 6,650,667 B2 | 11/2003 | Nasu et al. |
| 6,654,564 B1 | 11/2003 | Colbourne et al. |
| 6,658,031 B2 | 12/2003 | Tuganov et al. |
| 6,665,351 B2 | 12/2003 | Hedberg et al. |
| 6,687,278 B1 | 2/2004 | Mason et al. |
| 6,690,686 B2 | 2/2004 | Delfyett |
| 6,738,398 B2 | 5/2004 | Hirata |
| 6,748,133 B2 | 6/2004 | Liu et al. |
| 6,778,307 B2 | 8/2004 | Clark |
| 6,785,308 B2 | 8/2004 | Dyer et al. |
| 6,807,215 B2 | 10/2004 | Lam et al. |
| 6,810,047 B2 | 10/2004 | Oh et al. |
| 6,815,786 B2 | 11/2004 | Ogasawara et al. |
| 6,834,134 B2 | 12/2004 | Brennan et al. |
| 6,836,487 B1 | 12/2004 | Farmer et al. |
| 6,847,758 B1 | 1/2005 | Watanabe |
| 6,943,951 B2 | 9/2005 | Kikuchi et al. |
| 6,947,206 B2 | 9/2005 | Tsadka et al. |
| 6,963,685 B2 | 11/2005 | Mahgerefteh et al. |
| 7,013,090 B2 | 3/2006 | Adachi et al. |
| 7,027,470 B2 | 4/2006 | May |
| 7,054,538 B2 | 5/2006 | Mahgerefteh et al. |
| 7,073,956 B1 | 7/2006 | Shin et al. |
| 7,076,170 B2 | 7/2006 | Choa |
| 7,123,846 B2 | 10/2006 | Tateyama et al. |
| 7,164,865 B2 | 1/2007 | Tatsuno et al. |
| 7,187,821 B2 | 3/2007 | Matsui et al. |
| 7,263,291 B2 | 8/2007 | Mahgerefteh et al. |
| 7,280,721 B2 | 10/2007 | McCallion et al. |
| 7,352,968 B2 | 4/2008 | Tayebati |
| 7,356,264 B2 | 4/2008 | Mahgerefteh et al. |
| 7,376,352 B2 | 5/2008 | Tayebati |
| 7,406,267 B2 | 7/2008 | Mahgerefteh et al. |
| 7,433,605 B2 | 10/2008 | Mahgerefteh et al. |
| 7,474,858 B2 | 1/2009 | Lee et al. |
| 7,474,859 B2 | 1/2009 | Mahgerefteh et al. |
| 7,477,851 B2 | 1/2009 | Mahgerefteh et al. |
| 7,480,464 B2 | 1/2009 | McCallion et al. |
| 7,492,976 B2 | 2/2009 | Mahgerefteh et al. |
| 7,502,532 B2 | 3/2009 | McCallion et al. |
| 7,505,694 B2 | 3/2009 | Johnson et al. |
| 7,515,626 B2 | 4/2009 | Lee et al. |
| 7,536,113 B2 | 5/2009 | Matsui et al. |
| 7,542,683 B2 | 6/2009 | Matsui et al. |
| 7,555,225 B2 | 6/2009 | Mahgerefteh et al. |
| 7,558,488 B2 | 7/2009 | Matsui et al. |
| 7,564,889 B2 | 7/2009 | Matsui et al. |
| 7,609,977 B2 | 10/2009 | Matsui et al. |
| 7,613,401 B2 | 11/2009 | Matsui et al. |
| 7,616,902 B2 | 11/2009 | Mahgerefteh et al. |
| 7,630,425 B2 | 12/2009 | Tayebati et al. |
| 7,639,955 B2 | 12/2009 | Zheng et al. |
| 7,657,179 B2 | 2/2010 | Mahgerefteh et al. |
| 7,663,762 B2 | 2/2010 | Mahgerefteh et al. |
| 7,697,186 B2 | 4/2010 | McCallion et al. |
| 7,697,847 B2 | 4/2010 | Matsui et al. |
| 7,742,542 B2 | 6/2010 | Mahgerefteh et al. |
| 7,760,777 B2 | 7/2010 | Matsui et al. |
| 7,778,295 B2 | 8/2010 | Matsui et al. |
| 7,809,280 B2 | 10/2010 | Mahgerefteh et al. |
| 7,860,404 B2 | 12/2010 | Matsui et al. |
| 7,869,473 B2 | 1/2011 | Ye et al. |
| 7,941,057 B2 | 5/2011 | Mahgerefteh et al. |
| 7,962,044 B2 | 6/2011 | McCallion et al. |
| 7,962,045 B2 | 6/2011 | McCallion et al. |
| 7,991,291 B2 | 8/2011 | Matsui et al. |
| 8,068,742 B2 | 11/2011 | Cole et al. |
| 2001/0012430 A1 | 8/2001 | Usami et al. |
| 2001/0048705 A1 | 12/2001 | Kitaoka et al. |
| 2002/0002099 A1 | 1/2002 | Hara et al. |
| 2002/0012369 A1 | 1/2002 | Nasu et al. |
| 2002/0044738 A1 | 4/2002 | Jablonski |
| 2002/0048290 A1 | 4/2002 | Tanaka et al. |
| 2002/0063930 A1 | 5/2002 | Blauvelt |
| 2002/0131047 A1 | 9/2002 | Zarrabian et al. |
| 2002/0154372 A1 | 10/2002 | Chung et al. |
| 2002/0159490 A1 | 10/2002 | Karwacki |
| 2002/0176659 A1 | 11/2002 | Lei et al. |
| 2003/0002120 A1 | 1/2003 | Choa |
| 2003/0063647 A1 | 4/2003 | Yoshida et al. |
| 2003/0067952 A1 | 4/2003 | Tsukiji et al. |
| 2003/0077031 A1 | 4/2003 | Zhang et al. |
| 2003/0099018 A1 | 5/2003 | Singh et al. |
| 2003/0147114 A1 | 8/2003 | Kang et al. |
| 2003/0161370 A1 | 8/2003 | Buimovich et al. |
| 2003/0169787 A1 | 9/2003 | Vurgaftman et al. |
| 2003/0193974 A1 | 10/2003 | Frankel et al. |
| 2003/0210912 A1 | 11/2003 | Leuthold |
| 2004/0008933 A1 | 1/2004 | Mahgerefteh et al. |
| 2004/0008937 A1 | 1/2004 | Mahgerefteh et al. |
| 2004/0036943 A1 | 2/2004 | Freund et al. |
| 2004/0076199 A1 | 4/2004 | Wipiejewski et al. |
| 2004/0081386 A1 | 4/2004 | Morse et al. |
| 2004/0086012 A1 | 5/2004 | Kitaoka et al. |
| 2004/0096221 A1 | 5/2004 | Mahgerefteh et al. |
| 2004/0109698 A1 | 6/2004 | Kim et al. |
| 2004/0218890 A1 | 11/2004 | Mahgerefteh et al. |
| 2004/0234200 A1 | 11/2004 | Jennings et al. |
| 2005/0074244 A1 | 4/2005 | Roberts et al. |
| 2005/0100345 A1 | 5/2005 | Welch et al. |
| 2005/0111852 A1 | 5/2005 | Mahgerefteh et al. |
| 2005/0152702 A1 | 7/2005 | Mahgerefteh et al. |
| 2005/0163512 A1 | 7/2005 | Tayebati et al. |
| 2005/0169638 A1 | 8/2005 | Tayebati et al. |

| | | | | | | |
|---|---|---|---|---|---|---|
| 2005/0169642 | A1 | 8/2005 | Mahgerefteh et al. | JP | 2004-551835 | 7/2008 |
| 2005/0175356 | A1 | 8/2005 | McCallion et al. | JP | 2004-551835 | 3/2010 |
| 2005/0196177 | A1 | 9/2005 | Moran | JP | 2009-504345 | 4/2010 |
| 2005/0206989 | A1 | 9/2005 | Marsh | JP | 2009-504345 | 10/2010 |
| 2005/0213993 | A1 | 9/2005 | Kazemi-Nia et al. | KR | 102008-7027139 | 4/2010 |
| 2005/0249509 | A1 | 11/2005 | Nagarajan et al. | WO | WO9905804 | 2/1999 |
| 2005/0265733 | A1 | 12/2005 | Kao et al. | WO | WO0104999 | 1/2001 |
| 2005/0271394 | A1 | 12/2005 | Whiteaway et al. | WO | WO 0117076 | 3/2001 |
| 2005/0286829 | A1 | 12/2005 | Mahgerefteh et al. | WO | WO 0118919 | 3/2001 |
| 2005/0286909 | A1 | 12/2005 | Kish, Jr. et al. | WO | WO03005512 | 7/2002 |
| 2006/0002718 | A1 | 1/2006 | Matsui et al. | | | |
| 2006/0008272 | A1 | 1/2006 | Abeles et al. | | | |
| 2006/0018666 | A1 | 1/2006 | Matsui et al. | | | |
| 2006/0029358 | A1 | 2/2006 | Mahgerefteh et al. | | | |
| 2006/0029396 | A1 | 2/2006 | Mahgerefteh et al. | | | |
| 2006/0029397 | A1 | 2/2006 | Mahgerefteh et al. | | | |
| 2006/0078336 | A1 | 4/2006 | McNicol et al. | | | |
| 2006/0078338 | A1 | 4/2006 | Johnson et al. | | | |
| 2006/0120416 | A1 | 6/2006 | Hu et al. | | | |
| 2006/0193636 | A1 | 8/2006 | Katagiri et al. | | | |
| 2006/0228120 | A9 | 10/2006 | McCallion et al. | | | |
| 2006/0233556 | A1 | 10/2006 | Mahgerefteh et al. | | | |
| 2006/0239306 | A1 | 10/2006 | Donohoe | | | |
| 2006/0274993 | A1 | 12/2006 | Mahgerefteh et al. | | | |
| 2007/0064759 | A1 | 3/2007 | Kobayashi et al. | | | |
| 2007/0286608 | A1 | 12/2007 | Matsui et al. | | | |
| 2008/0002990 | A1 | 1/2008 | McCallion et al. | | | |
| 2008/0037608 | A1 | 2/2008 | Zhou et al. | | | |
| 2008/0159747 | A1 | 7/2008 | Mahgerefteh et al. | | | |
| 2008/0166134 | A1 | 7/2008 | McCallion et al. | | | |
| 2008/0181619 | A1 | 7/2008 | Heismann | | | |
| 2008/0187325 | A1 | 8/2008 | McCallion et al. | | | |
| 2008/0193132 | A1 | 8/2008 | Matsui et al. | | | |
| 2008/0193144 | A1 | 8/2008 | Zhou et al. | | | |
| 2008/0240180 | A1 | 10/2008 | Matsui et al. | | | |
| 2008/0247763 | A1 | 10/2008 | Mahgerefteh et al. | | | |
| 2008/0247765 | A1 | 10/2008 | Mahgerefteh et al. | | | |
| 2008/0291950 | A1 | 11/2008 | McCallion et al. | | | |
| 2009/0003842 | A1 | 1/2009 | Mahgerefteh et al. | | | |
| 2009/0060526 | A1 | 3/2009 | Matsui et al. | | | |
| 2009/0080905 | A1 | 3/2009 | Olsson | | | |
| 2009/0196631 | A1 | 8/2009 | Daghighian et al. | | | |
| 2009/0238224 | A1 | 9/2009 | Ye | | | |
| 2009/0269069 | A1 | 10/2009 | Mahgerefteh et al. | | | |
| 2010/0008679 | A1 | 1/2010 | Cole | | | |
| 2010/0098436 | A1 | 4/2010 | Mahgerefteh et al. | | | |
| 2010/0279447 | A1 | 11/2010 | Matsui et al. | | | |
| 2010/0311195 | A1 | 12/2010 | Matsui et al. | | | |

FOREIGN PATENT DOCUMENTS

| | | |
|---|---|---|
| CN | 1236891 | 12/1999 |
| CN | 200380108289.9 | 11/2007 |
| CN | 200380108289.9 | 8/2008 |
| CN | 200380108289.9x | 11/2008 |
| CN | 200580015245.0 | 9/2009 |
| CN | 200580012705.4 | 3/2010 |
| CN | 200580015245.0 | 3/2010 |
| CN | 2005800378071 | 5/2010 |
| CN | 200880009551.7 | 7/2010 |
| EP | 0524758 | 7/1992 |
| EP | 602659 | 6/1994 |
| EP | 05731268.8 | 1/2008 |
| EP | 05764209.2 | 6/2009 |
| EP | 05731268.8 | 5/2010 |
| GB | 2 107 147 | 4/1983 |
| JP | 58-075340 | 5/1983 |
| JP | 62-189832 | 8/1987 |
| JP | 06-283802 | 10/1994 |
| JP | 09-214427 | 8/1997 |
| JP | 11-031859 | 2/1999 |
| JP | 2000105313 | 4/2000 |
| JP | 2001-036477 | 2/2001 |
| JP | 2001-284711 | 10/2001 |
| JP | 2001291928 | 10/2001 |
| JP | 2001320328 | 11/2001 |
| JP | 2002243935 | 8/2002 |
| JP | 2002267834 | 9/2002 |
| JP | 2002267998 | 9/2002 |
| JP | 2002-311235 | 10/2002 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Chang-Hang Lee et al, Transmission of Directly Modulated 2.5-Gb/s Signals Over 250 km of Nondispersion-Shifted Fiber by Using a Spectral Filtering Method, IEEE Photonics Technology Letters, vol. 8, No. 12 Dec. 1996 pp. 1725-7127.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Dischler et al., Experimental Assessment of a Direct Detection Optical OFDM System Targeting 10Gb/s and Beyond, Optical Fiber Communication/National Fiber Optic Engineers Conference, Feb. 24-28, 3 pages, San Diego, CA.

Dong Jae Shin, et al., Low-cost WDM-PON with Colorless Bidirectional Tranceivers, Journal of Lightwave Technology, Jan. 2006, pp. 158-165, vol. 24, No. 1.

Freund et al, 30 Gbit/s RZ 8-PSK Transmission over 2800 km Standard Single Mode Fibre without Inline Dispersion Compensation, 2007, 3 pages.

Hyryniewicz, J.V., et al., Higher Order Filter Response in Coupled Microring Resonators, IEEE Photonics Technology Letters, Mar. 2000, 320-322, vol. 12, No. 3.

Kikuchi, Nobuhiko et al., Experimental Demonstration of Incoherent Optical Multilevel Staggered-APSK (Amplitude- and Phase-Shift Keying) Signaling, Optical Fiber Communication/National Fiber Optic Engineers Conference, Feb. 24-28, 2008, 3 pages, San Diego, CA.

Kiyoshi Fukuchi, Proposal and Feasibility Study of a 6-level PSK modulation format based system for 100 Gg/s migration, 2007, 3 pages.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Lammert et al., MQW DBR Lasers with Monolithically Integrated External-Cavity Electroabsorption Modulators Fabricated Without Modification of the Active Region, IEEE Photonics Technology Letters, vol. 9, No. 5, May 1997, pp. 566-568.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mahgerefteh et al., Chirp managed laser (CML): A compact transmitter for dispersion tolerant 10 Gb/s networking applications; Optical Fiber Communication Conference, 2006 and the 2006 National Fiber Optic Engineers Conference. OFC 2006, Mar. 5-10, 2006; Digital Object Identifier: 10.1109/OFC.2006.215459.

Matsui, Yasuhiro et al, Chirp-Managed Directly Modulated Laser (CML), IEEE Photonics Technology Letters, Jan. 15, 2006, pp. 385-387, vol. 18, No. 2.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Nakahara, K. et al, 40-Gb/s Direct Modulation With High Extinction Ratio Operation of 1.3-μm.InGaAlAs Multiquantum Well Ridge Waveguide Distributed Feedback Lasers, IEEE Photonics Technology Letters, Oct. 1, 2007, pp. 1436-1438, vol. 19 No. 19.

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

Sekine, Kenro et al., Advanced Multi-level Transmission Systems, Optical Fiber Communication/National Fiber Optic Engineers Conference, Feb. 24-28, 2008, 3 pages, San Diego, Ca.

Shalom, Hamutal et al., On the Various Time Constants of Wavelength Changes of a DFB Laser Under Direct Modulation, IEEE Journal of Quantum Electronics, Oct. 1998, pp. 1816-1822, vol. 34, No. 10.

Tokle, Torger et al., Advanced Modulation Formats for Transmission Systems, Optical Fiber Communication/National Fiber Optic Engineers Conference, Feb. 24-28, 2008, 3 pages, San Diego, CA.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Wesstrom et al., State-of-the-art performance of widely tunable modulated grating Y-branch lasers; Optical Fiber Communication Conference, 2004. OFC 2004, vol. 1, No., pp. 2 vol. (1800), Feb. 23-27, 2004; doi: 10.1109/OFC.2004.1349295.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

U.S. Appl. No. 11/964,315, Aug. 25, 2010, Office Action.
U.S. Appl. No. 11/964,315, Feb. 4, 2011, Notice of Allowance.
U.S. Appl. No. 11/964,321, Aug. 25, 2010, Office Action.
U.S. Appl. No. 11/964,321, Dec. 29, 2010, Notice of Allowance.
U.S. Appl. No. 12/014,676, Oct. 4, 2010, Office Action.
U.S. Appl. No. 12/014,676, Mar. 18, 2011, Notice of Allowance.
U.S. Appl. No. 12/014,676, Jun. 29, 2011, Supp Notice of Allowance.
U.S. Appl. No. 12/017,957, Nov. 5, 2010, Office Action.
U.S. Appl. No. 12/017,957, Apr. 25, 2011, Office Action.
U.S. Appl. No. 12/017,957, Oct. 26, 2011, Notice of Allowance.
U.S. Appl. No. 12/025,573, Oct. 6, 2010, Office Action.
U.S. Appl. No. 12/025,573, Feb. 7, 2011, Notice of Allowance.
U.S. Appl. No. 12/028,675, Oct. 27, 2010, Office Action.
U.S. Appl. No. 12/028,675, Mar. 24, 2011, Notice of Allowance.
U.S. Appl. No. 12/028,678, Dec. 8, 2010, Office Action.
U.S. Appl. No. 12/028,678, May 16, 2011, Notice of Allowance.
U.S. Appl. No. 12/047,017, Jun. 1, 2010, Restriction Requirement.
U.S. Appl. No. 12/047,017, Aug. 6, 2010, Office Action.
U.S. Appl. No. 12/047,017, Sep. 27, 2010, Notice of Allowance.
U.S. Appl. No. 12/053,344, Apr. 1, 2010, Office Action.
U.S. Appl. No. 12/053,344, Sep. 3, 2010, Notice of Allowance.
U.S. Appl. No. 12/115,337, Mar. 4, 2010, Office Action.
U.S. Appl. No. 12/115,337, Aug. 20, 2010, Office Action.
U.S. Appl. No. 12/115,337, Oct. 28, 2010, Notice of Allowance.
U.S. Appl. No. 12/184,137, Dec. 2, 2010, Notice of Allowance.
U.S. Appl. No. 12/126,717, Apr. 7, 2011, Office Action.
U.S. Appl. No. 12/126,717, Sep. 12, 2011, Office Action.
U.S. Appl. No. 12/188,407, Jun. 30, 2011, Office Action.
U.S. Appl. No. 12/188,407, Mar. 2, 2011, Office Action.
U.S. Appl. No. 12/839,310, Apr. 28, 2011, Ex Parte Action.
U.S. Appl. No. 12/839,310, Sep. 27, 2011, Office Action.
U.S. Appl. No. 12/566,471, Jan. 20, 2011, Office Action.
U.S. Appl. No. 12/566,471, Jul. 27, 2011, Office Action.
U.S. Appl. No. 12/566,471, Dec. 5, 2011, Notice of Allowance.
U.S. Appl. No. 12/110,071, May 12, 2011, Office Action.
U.S. Appl. No. 12/857,465, Nov. 18, 2011, Office Action.
U.S. Appl. No. 12/171,201, Jul. 19, 2011, Notice of Allowance.
Mahgerefteh, D. and Fan, F., Chirp-managed-laser technology delivers > 250-km reach, Lightwave Online, 2005, PennWell Corporation. Accessed online Jul. 1, 2009 at: http://www.finisar.com/download_31wMeaCML_Application%20White%20Paper-LW.pdf.

THERMAL CHIRP COMPENSATION IN A CHIRP MANAGED LASER

BACKGROUND

Chirped managed lasers (CMLs), such as distributed feedback (DFB) lasers and tunable distributed Bragg reflector (DBR) lasers, are commonly employed to transmit optical signals. For example, CMLs are currently employed in transceivers and transponders for telecom and datacom applications. However, CMLs have traditionally been limited to use in very short reach (<10-km) applications at 10 Gb/s. This limitation is due at least in part to the thermal chirp exhibited by CMLs.

Thermal chirp in CMLs degrades the low frequency response of CMLs, and degrades the low frequency cut off of the frequency response. As a result, CMLs generate pattern dependence, error floor, and/or poor mask margin.

BRIEF SUMMARY OF SOME EXAMPLE EMBODIMENTS

In general, example embodiments of the invention relate to thermal chirp compensation in chirp managed lasers (CMLs), including distributed feedback (DFB) lasers and tunable distributed Bragg reflector (DBR) lasers. Example methods and devices decrease thermal-chirp-induced low frequency cut-off in CMLs.

In one example embodiment, a method for thermal chirp compensation in a CML laser includes several acts. First, a first bias condition and temperature is selected. Next, a first thermal chirp compensation signal is generated. The first thermal chirp compensation signal corresponds to a predetermined level of thermal chirp that is induced in a laser by operating the laser at the first bias condition and temperature. Then, the laser is driven by biasing a first input drive signal with the first thermal chirp compensation signal. Next, a second bias condition and temperature is selected. Then, a second thermal chirp compensation signal is generated. The second thermal chirp compensation signal corresponds to a predetermined level of thermal chirp that is induced in the laser by operating the laser at the second bias condition and temperature. Finally, the laser is driven by biasing a second input drive signal with the second thermal chirp compensation signal.

In another example embodiment, a thermal chirp compensation device includes an analog-to-digital converter, a digital signal processor in electrical communication with the analog-to-digital converter, and a digital-to-analog converter in electrical communication with the digital signal processor. The digital signal processor is configured to generate bias condition and temperature specific thermal chirp compensation signals that each corresponds to a predetermined level of thermal chirp that is induced in a laser by operating the laser at a particular bias condition and temperature.

In yet another example embodiment, a transmitter includes a laser package, a laser driver in electrical communication with the laser package, and a thermal chirp compensation device in communication with the laser package and the laser driver. The laser package includes a laser and an optical spectrum reshaper configured to convert frequency modulated optical signals from the laser into an amplitude modulated optical signals. The thermal chirp compensation device includes means for generating bias condition and temperature specific thermal chirp compensation signals that each corresponds to a predetermined level of thermal chirp that is induced in the laser by operating the laser at a particular bias condition and temperature.

BRIEF DESCRIPTION OF THE DRAWINGS

To further clarify certain aspects of embodiments of the present invention, a more particular description will be rendered by reference to specific embodiments thereof which are disclosed in the appended drawings. It is appreciated that these drawings depict only example embodiments of the invention and are therefore not to be considered limiting of its scope. Aspects of example embodiments will be described and explained with additional specificity and detail through the use of the accompanying drawings in which.

DETAILED DESCRIPTION OF SOME EXAMPLE EMBODIMENTS

Example embodiments of the present invention relate to methods and devices for thermal chirp compensation in chirp managed lasers (CMLs), including distributed feedback (DFB) lasers and tunable distributed Bragg reflector (DBR) lasers. Example methods and devices decrease thermal-chirp-induced low frequency cut-off in tunable CMLs.

1. Example 13 Pin-GPO Butterfly Transmitter Package

Figure 1:
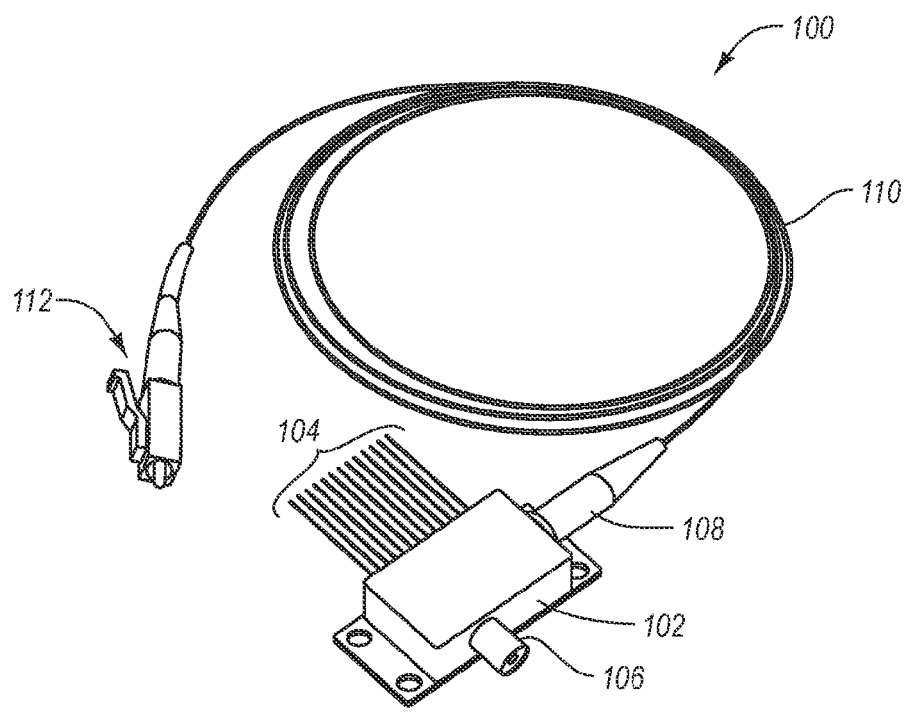
FIG. 1 is a perspective view of an example 13 pin-general purpose output (GPO) butterfly transmitter package.

One environment in which the example methods and devices for thermal chirp compensation disclosed herein can be employed is an example 13 pin-general purpose output (GPO) butterfly transmitter package 100 of FIG. 1. The example transmitter package 100 is configured to transmit 10 Gb/s-100 Gb/s data over physical distances up to 600 km. The example transmitter package 100 includes a housing 102 within which several optical and electrical components are positioned (as discussed elsewhere herein in connection with FIG. 3). The example transmitter package 100 also includes thirteen pins 104, a GPO connector 106, and a fiber pigtail 108 extending from the housing 102. A single-mode fiber 110 is attached to the fiber pigtail 108, and an LC-type fiber connector 112 is attached to the single-mode fiber 110, although the LC-type fiber connector 112 could be replaced with an FC-type fiber connector (not shown).

The example transmitter package 100 is typically mounted to a printed circuit board (PCB) of an optoelectronic module, such as an optoelectronic transmitter module, or an optoelectronic transceiver or transponder module for example (not shown). The PCB is configured to send data and control signals to the internal components of example transmitter package 100 through the pins 104, which results in optical data signals being transmitted to the connector 112 through the fiber pigtail 108 and the single-mode fiber 110.

2. Example TOSA Package

Figure 2:
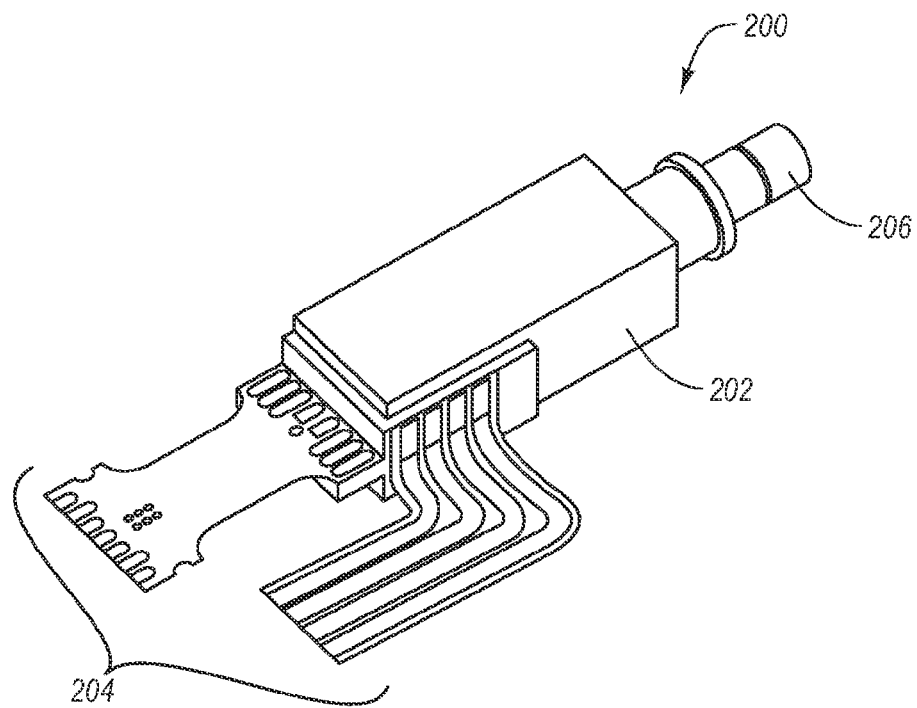
FIG. 2 is a perspective view of an example transmitter optical sub assembly (TOSA) package.

Another environment in which the example methods and devices for thermal chirp compensation disclosed herein can be employed is an example transmitter optical sub assembly (TOSA) package 200 of FIG. 2. The example TOSA package 200 is similarly configured to transmit 10 Gb/x-100 Gb/x data over physical distances up to 600 km. The example TOSA package 200 includes a housing 202 within which several optical and electrical components are positioned (as discussed elsewhere herein in connection with FIG. 3). The example TOSA package 200 also includes 13 pins 204 and an LC-type receptacle 206 extending from the housing 202, although the LC-type receptacle 206 could be replaced with an SC-type receptacle (not shown).

The example TOSA package 200 is typically mounted to a printed circuit board (PCB) of an optoelectronic module, such as an optoelectronic transmitter module, or an optoelectronic transceiver or transponder module for example (not shown). The PCB is configured to send data and control signals to the internal components of example TOSA package 200 through the pins 204, which results in optical data signals being transmitted to the receptacle 206.

3. Example Internal Components

Figure 3:
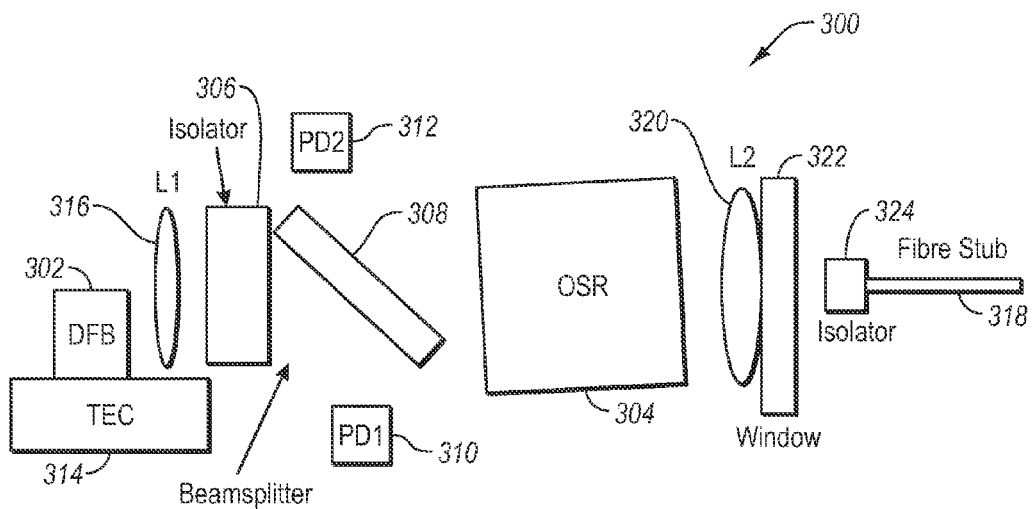
FIG. 3 is a diagram of example components of both the example 13 pin-GPO butterfly transmitter package of FIG. 1 and the example TOSA package of FIG. 2.

With reference now to FIG. 3, example internal components 300 of the example 13 pin-GPO butterfly transmitter package 100 and the example TOSA package 200 are disclosed. The example internal components 300 include a directly modulated DFB laser 302 co-packaged with an optical spectral re-shaper (OSR) 304.

An optical isolator 306 is included between the DFB laser 302 and the OSR 304 while a beam-splitter 308 and two photodetectors 310 and 312 are configured to allow frequency locking. The output power of the DFB laser 302 is monitored by the photodetector 310. The photodetector 312 monitors the back-reflection from the OSR 304. The photocurrent ratio from the two photodetector 310 and 312 is used to lock the relative spectral locations of the DFB laser 302 and the OSR 304 via temperature control of the DFB laser 302 using a thermoelectric cooler 314.

A first lens 316 is used to collimate the DFB laser 302 laser output and pass the beam through the beamsplitter 308 and the OSR 304, prior to coupling into a single-mode fiber 318 using a second lens 320 and a window 322. A second isolator 324 may be included to minimize the effect of external back-reflections on package performance.

4. Example Transmitter

Figure 4:
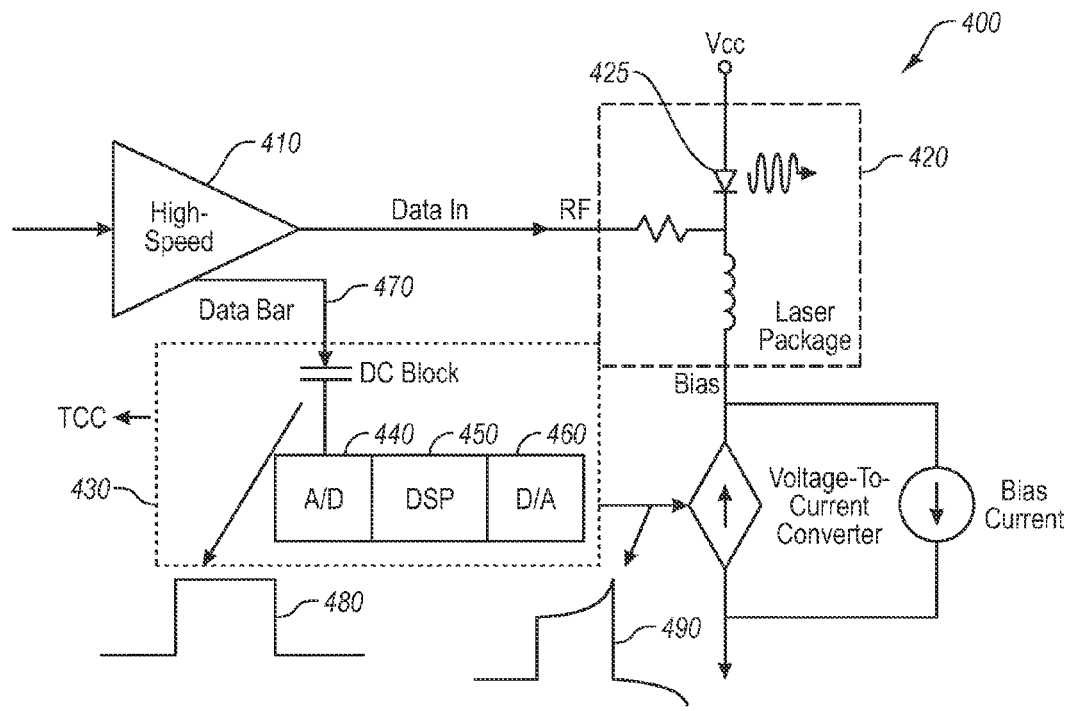
FIG. 4 is a diagram of an example transmitter including an example thermal chirp compensation device.

With reference now to FIG. 4, an example transmitter 400 is disclosed. The example transmitter 400 includes an example high speed driver 410, an example laser package 420, and an example thermal chirp compensation (TCC) device 430. The example high speed driver 410 is configured to convert high speed data signals into input drive signals. The example laser package 420 can be the example 13 pin-GPO butterfly transmitter package 100 or the example TOSA package 200 and may include a DFB laser or a tunable DBR laser, for example. The example laser package 420 includes a laser 425.

The example TCC device 430 includes an analog-to-digital converter 440, a digital signal processor (DSP) 450, and a digital-to-analog converter 460. The DSP 450 is in electrical communication with the analog-to-digital converter 440, and the digital-to-analog converter 460 is in electrical communication with the DSP 450.

The DSP 450 is configured to generate bias condition and temperature specific thermal chirp compensation signals that each corresponds to a predetermined level of thermal chirp that is induced in the laser 425, in a gain section of laser 425 for example, by operating the laser 425 at a particular bias condition and temperature. Further, the DSP 450 can be programmable and may also be in electrical communication with a memory (not shown) that stores calibration data corresponding to each bias condition and temperature at which the laser 425 is capable of operating. In an alternative configuration, instead of the laser package 420 with the single laser 425, the DSP 450 can generate bias condition and temperature specific thermal chirp compensation signals for a multi-section laser package having multiple lasers. In this alternative configuration, the thermal chirp compensation signals can be added to a dedicated section for thermal chirp compensation or to a dedicated section for improving low frequency response.

5. Example Method for Thermal Chirp Compensation in a CML

Figure 5:
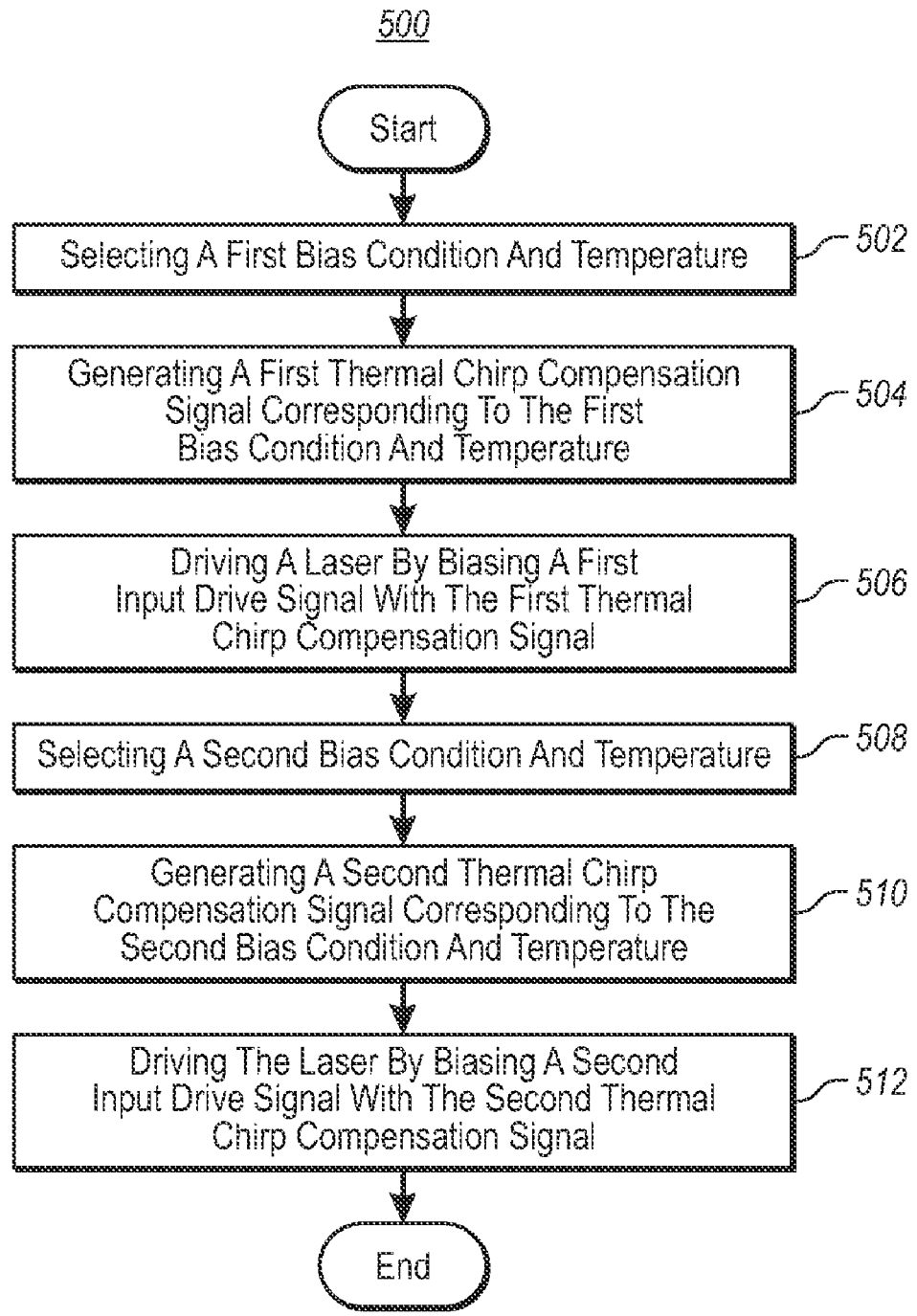
FIG. 5 is a flowchart of an example method for thermal chirp compensation in a CML laser.

With reference now to FIG. 5, an example method for thermal chirp compensation in a CML laser transmitter 500 is disclosed. The example method 500 includes several acts which result in decreased thermal-chirp-induced low frequency cut-off in CMLs. The example method 500 will now be discussed below in connection with FIG. 4.

First, at 502, a first bias condition and temperature is selected. For example, the selected first bias condition and temperature may correspond to a first output wavelength of the output wavelengths at which the laser 425 is capable of operating. The first output wavelength may be one of the ITU-T C-band and L-band channels that are between 1527.773 nm and 1605.744 nm. The first output wavelength may also be communicated to the TCC device 430 through the communication line 470.

Next, at 504, a first thermal chirp compensation signal is generated. The first thermal chirp compensation signal corresponds to a predetermined level of thermal chirp that is induced in the laser 425 by operating the laser 425 at the first bias condition and temperature. For example, the DSP 450 may communicate with a memory (not shown) that stores calibration data corresponding to each bias condition and temperature at which the laser 425 is capable of operating. This calibration data may then be used by the DSP 450 to calculate the first thermal chirp compensation signal. The DSP may generate a first thermal chirp compensation signal by solving the following formula for the first compensation signal $S_{comp}$:

$$S_{comp}*H(t)+S_{input\ drive}(t)*H(t)=S_{comp\ drive}(t)$$

where:
H(t) is a transform function of the predetermined level of thermal chirp that is induced in the laser 425 by operating the laser 425 at the first bias condition and temperature;
$S_{input\ drive}(t)$ is the first input drive signal;
$S_{comp\ drive}(t)$ is a compensated first input drive signal; and
* is a convolution operator.

H(t) may be calculated by de-convolving $S_{input\ drive}(t)$ and an output signal of the laser 425 that is driven without compensation. H(t) may alternatively be calculated using a fast Fourier transform (FFT).

Then, at 506, the laser is driven by biasing a first input drive signal with the first thermal chirp compensation signal. For example, the laser 425 is driven by biasing a first input drive signal 480 with the first thermal chirp compensation signal 490.

Next, at 508, a second bias condition and temperature is selected. For example, the selected second bias condition and temperature may correspond to a second output wavelength of the ITU-T C-band and L-band channels that is different from the first output wavelength corresponding to the selected first bias condition and temperature selected at 502.

Then, at 510, a second thermal chirp compensation signal is generated. The second thermal chirp compensation signal corresponds to a predetermined level of thermal chirp that is induced in the laser by operating the laser at the second bias condition and temperature. For example, the DSP 450 may communicate with a memory (not shown) that stores calibration data corresponding to the second output wavelength corresponding to the selected second bias condition and temperature. This calibration data may then be used by the DSP 450 to calculate the second thermal chirp compensation signal. The DSP 450 may generate the second thermal chirp compensation signal by solving the following formula above for the first compensation signal $S_{comp}$ using updated $H(t)$, $S_{input\ drive}(t)$, and $S_{comp\ drive}(t)$ parameters.

Finally, at 512, the laser is driven by biasing a second input drive signal with the second thermal chirp compensation signal. For example, the laser 425 is driven by biasing the second input drive signal 480 with the second thermal chirp compensation signal 490.

Figure 6:
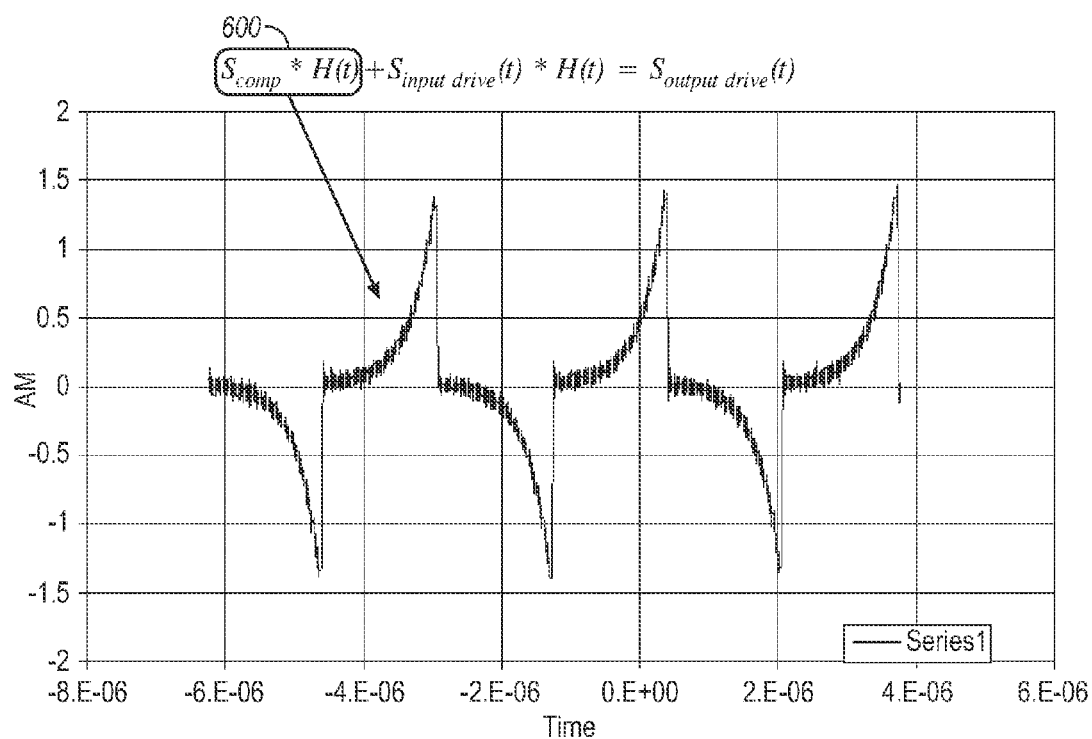
FIG. 6 is a chart showing an example thermal chirp compensation signal.
Figure 7:
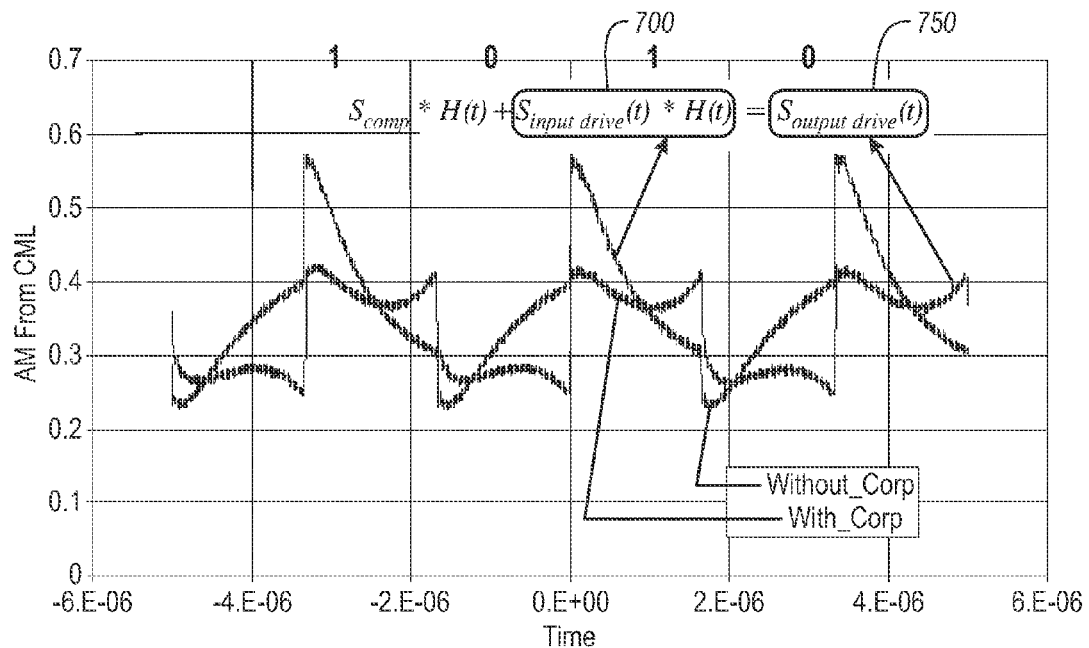
FIG. 7 is a chart showing example drive signals with and without thermal chirp compensation.

With reference now to FIG. 6, an example thermal chirp compensation signal 600 is disclosed. With reference to FIG. 7, example drive signals without thermal chirp compensation 700 and with thermal chirp compensation 750 are disclosed. The example drive signal with thermal chirp compensation 750 reduces the thermal-chirp-induced low frequency cut-off visible in the example drive signals without thermal chirp compensation 700.

The example embodiments disclosed herein may be embodied in other specific forms. The example embodiments disclosed herein are to be considered in all respects only as illustrative and not restrictive.

What is claimed is:

1. A method for thermal chirp compensation in a chirp managed laser (CML), the method comprising:
   selecting a first bias condition and temperature;
   generating a first thermal chirp compensation signal corresponding to a predetermined level of thermal chirp that is induced in a laser by operating the laser at the first bias condition and temperature;
   driving the laser by biasing a first input drive signal with the first thermal chirp compensation signal;
   selecting a second bias condition and temperature;
   generating a second thermal chirp compensation signal corresponding to a predetermined level of thermal chirp that is induced in the laser by operating the laser at the second bias condition and temperature; and
   driving the laser by biasing a second input drive signal with the second thermal chirp compensation signal.

2. The method as recited in claim 1, wherein generating a first thermal chirp compensation signal corresponding to a predetermined level of thermal chirp that is induced in the laser by operating the laser at the first bias condition and temperature comprises solving the following formula for the first compensation signal $S_{comp}$:

$$S_{comp}*H(t)+S_{input\ drive}(t)*H(t)=S_{output\ drive}(t)$$

where:
   $H(t)$ is a transform function of the predetermined level of thermal chirp that is induced in the laser by operating the laser at the first bias condition and temperature;
   $S_{input\ drive}(t)$ is the first input drive signal;
   $S_{output\ drive}(t)$ is a compensated first input drive signal; and
   * is a convolution operator.

3. The method as recited in claim 2, wherein $H(t)$ is calculated by de-convolving $S_{input\ drive}(t)$ and an output signal of the laser that is driven without compensation.

4. The method as recited in claim 2, wherein $H(t)$ is calculated using a fast Fourier transform (FFT).

5. The method as recited in claim 2, wherein the laser comprises a distributed feedback (DFB) laser or a distributed Bragg reflector (DBR) laser.

6. The method as recited in claim 3, wherein the laser is packaged in a transmitter optical sub assembly (TOSA).

7. The method as recited in claim 3, wherein the laser is packaged in a transmitter 13 pin-general purpose output (GPO) butterfly transmitter package.

\* \* \* \* \*